(12) United States Patent
Yew et al.

(10) Patent No.: US 6,218,202 B1
(45) Date of Patent: Apr. 17, 2001

(54) SEMICONDUCTOR DEVICE TESTING AND BURN-IN METHODOLOGY

(75) Inventors: Chee Kiang Yew; Kim Hoch Tey; Min Yu Chan; Jeffrey Tuck Fock Toh, all of Singapore (SG)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/167,401

(22) Filed: Oct. 6, 1998

(51) Int. Cl.⁷ .............................. H01L 21/66; G01R 31/26
(52) U.S. Cl. ................................. 438/15; 438/15; 438/14; 438/25; 438/26; 438/51; 438/55; 438/64; 438/106; 438/121; 257/48
(58) Field of Search ............................... 438/15, 14, 25, 438/64, 26, 51, 55, 106, 121; 257/48

(56) References Cited

U.S. PATENT DOCUMENTS

| | | | |
|---|---|---|---|
| 5,289,631 | * | 3/1994 | Koopman et al. ..................... 29/840 |
| 5,290,710 | * | 3/1994 | Haj-Ali-Ahmadi et al. ............ 437/8 |
| 5,525,545 | * | 6/1996 | Grube et al. ......................... 437/209 |
| 5,541,525 | * | 7/1996 | Wood et al. ......................... 324/755 |
| 5,806,181 | * | 9/1998 | Khandros et al. ..................... 29/874 |
| 5,888,837 | * | 3/1999 | Fillion et al. ............................ 438/15 |
| 6,072,322 | * | 6/2000 | Vlswanath et al. ................... 324/754 |

* cited by examiner

Primary Examiner—Matthew Smith
Assistant Examiner—Granvill D Lee, Jr.
(74) Attorney, Agent, or Firm—Gary C. Honeycutt; Fred Telecky; Arthur I. Navarro

(57) ABSTRACT

A packaged semiconductor device and a method for burn-in and testing are disclosed. The package comprises a carrier having a pattern of contact pads for electrical connection, and also a pattern of testing pads for electrical characterization such that their location, size and composition allows a conversion to contact pads after the device has been electrically characterized following burn-in. Furthermore, an adapter and a method for burn-in and testing are disclosed for use in testing a variety of different semiconductor devices. The adapter comprises a carrier having a pattern of testing pads bordering the carrier outline, and routing strips which are structured such that the carrier is adaptable to the package of the device being tested.

7 Claims, 5 Drawing Sheets

SEMICONDUCTOR DEVICE TESTING AND BURN-IN METHODOLOGY

The present invention relates in general to the field of semiconductor integrated circuit assembly and testing and more specifically to substantially flat packages standardized for burn-in and testing of devices from a range of semiconductor families, and a method for the fabrication.

BACKGROUND OF THE INVENTION

The trend in semiconductor technology to double the functional complexity of its products every 18 months (Moore's "law"), which is still valid today after having dominated the industry for the last three decades, has several implicit consequences. First, the cost per functional unit should drop with each generation of complexity so that the cost of the product with its doubled functionality would increase only slightly. Second, the higher product complexity should largely be achieved by shrinking the feature sizes of the chip components while holding the package dimensions constant; preferably, even the packages should shrink. Third, the increased functional complexity should be paralleled by an equivalent increase in reliability of the product. And fourth, but not least, the best financial profit rewards were held out for the ones who were ahead in the marketplace in reaching the complexity goal together with offering the most flexible products for application.

For semiconductor memory devices, historically the time span of at least three years has been needed between two generations of memory families. The new generation offers a four times larger memory capacity compared to the preceding generation. Again, shrinking circuit feature sizes and more complex memory hierarchies have been the prerequisite of the new product generation—at high development cost for chip design and fabrication processes, coupled with very expensive investment in costly new manufacturing equipment.

A number of technical advances have recently been achieved in an effort to obtain an advantage in this competitive marketplace. Within the semiconductor memory product families, one of the most promising concepts for shrinking the package outline and thus consuming less area when the device is mounted onto the circuit board, has been the so-called "board-on-chip" design replacing the traditional metallic leadframe. Patent application Ser. No. 9702348-5 entitled "Board on Chip—Ball Grid Array Chip Size Package" has been filed by Texas Instruments in Singapore on Jul. 02, 1997. This patent application for memory products successfully approaches the problem of reducing the area requirement by replacing the traditional leaded package design with a solder ball concept. In addition, it offers a reduction in the height requirement by replacing the leadframe-on-chip assembly with a thinner and more flexible board-on-chip design. Using the new concept, a high-density integrated circuit package has been described in patent application Ser. No. 9703963-0 entitled "High Density 3-Dimensional Stacked Ball Grid Array Integrated Circuit Module", filed by Texas Instruments in Singapore on Nov. 6, 1997. A new modification using thin board-on-chip devices entitled "Thin Board-on-Chip Integrated Circuit Unit" has been submitted by Texas Instruments in Singapore, also in 1997.

It is frustrating, though, that in spite of all this progress so much time and money has to be spent continuously for testing and burning-in each new package and each new device. Required are design and acquisition of dedicated burn-in and test sockets for each different input/output count and each different package configuration; dedicated sockets, boards, trays, tubes and handlers; lack of standardization of equipment and procedures for testing and burn-in; and limited comparison of accumulated data. Due to ever modified package outlines, testing and burn-in remain dedicated fabrication steps with no interchangeablity. Consequently, a need has arisen for package designs and methods of device fabrication that provide simple, low-cost designs for a universal fanout package concept with a configuration suitable for an entire device family. Preferably, these improvements should be accomplished using the installed equipment base so that no investment in new burn-in and testing facilities is needed.

SUMMARY OF THE INVENTION

The present invention comprises the design and manufacturing of integrated circuit packages with universal burn-in and testing features. Patterns of contact pads for electrical connection and patterns of testing pads for electrical characterization are defined so that the testing pads are adapted with location, size, and material composition for an eventual conversion to contact pads after the device has undergone burn-in and testing. The testing pads are preferably located remote from the contact pads. The present invention also defines the package design rules to permit universal use of burn-in sockets and boards, test handlers and boards, and transport trays and tubes for entire product families. These package design rules use the maximum number of input/output terminals expected for the product family and assign the terminals for the configuration of the specific capacity and architecture of the device, with equal functions assigned to equal terminals and unused terminals remaining unassigned.

It is an object of the present invention to provide a methodology for universal testing and burn-in of a complete family of semiconductor devices with devices of different input/output configuration.

Another object of the present invention is to provide a low-cost method for designing and fabricating the universal package features for testing.

Another object of the present invention is to increase the flexibility of device packages by adapting design and process features so that testing pads can optionally be converted to contact pads.

Another object of the present invention is to provide a design method of electrical connections, as well as low-cost process for fabrication, for parts of small outline packages of memory products suitable for producing stacked memory modules.

Another object of the present invention is to minimize the cost of capital investment and to use the installed fabrication equipment base.

Another object of the present invention is to provide reliability assurance for the finished product through in-process control at no extra cost.

These objects have been achieved by the package designs of the invention, the universal testing and burn-in concept for entire product families, and a mass production process. Various modifications have been employed for the package configurations and the assembly of packages and modules.

In one embodiment of the invention, a pattern of contact pads for electrical connection and a pattern of testing pads for electrical characterization are designed so that the testing pads have a size, location and material composition suitable for converting them to contact pads after the device has been burnt-in and electrically characterized.

In another embodiment of the invention, stacked modules of such devices have been created.

In another embodiment of the invention, the testing pads remain unconverted to contact pads.

In yet another embodiment of the invention, a standard auxiliary substrate, compatible with test sockets of the thin small-outline package (TSOP) families, has been manufactured to convert board-on-chip ball grid array BOC-BGA™ products to the installed socket facilities.

In another embodiment of the invention, a universal package handles the entire family of 64 Mbit DRAM, SDRAM, and EDO devices in the x4, x8, and x16 organizations.

The technical advance represented by the invention, as well as the objects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 1 depicts a first top view of the device showing the carrier with the bonding wires attached to the chip bonding pads.

FIG. 2 is a cross section of the assembled device.

FIG. 3 depicts a second top view of the device showing the carrier with the attached semiconductor chip.

DETAILED DESCRIPTION OF THE PREFERRED EMBODIMENTS

The present invention is related to high density and high frequency integrated circuits having both a low profile and a small outline package, and are assembled using existing manufacturing equipment. As defined herein, the term "outline" relates to the overall width and length of the integrated circuit package of the present invention. The outline of the package is also referred to as the footprint of the package, because it defines the surface area on a wiring or assembly board that the package will occupy. As defined herein, the term "profile" refers to the thickness of height of the integrated circuit package. This definition does include the height of the solder balls before they are reflown in board attachment.

The present invention is further related to semiconductor packages of the board-on-chip design of the ball-grid array family, which has been introduced by Texas Instruments under the trademark name BOC-BGA™. This package design enables a plurality of packages to be electrically connected as well as physically stacked together as modules for high density and high speed performance and for meeting the space constraints imposed on many semiconductor leadership products.

As defined herein, the term "packaged device" refers both to a semiconductor chip having been assembled for electrical connection, and to an assembled semiconductor chip being at least partially encapsulated. The term "package" refers to all entities of a semiconductor device other than the chip itself.

The present invention meets the requirement for space constraints of continually shrinking applications such as cellular communications, pagers, hard disk drives, laptop computers and medical instrumentation. The present invention also helps to maximize high density and high speed performance and addresses the problems associated with the electronic capacity of the chip assembly. The principles of the present invention may be incorporated into dynamic random-access memories (DRAM), Synchronous DRAM (SDRAM), static random-access memories (SRAM), erasable programmable read-only memories (EPROM), some logic circuits (LOGIC) and digital signal processors (DSP) and many other integrated circuit components.

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention. The impact of the present invention can be most easily appreciated by highlighting the shortcomings of the known technology.

Figure 1:
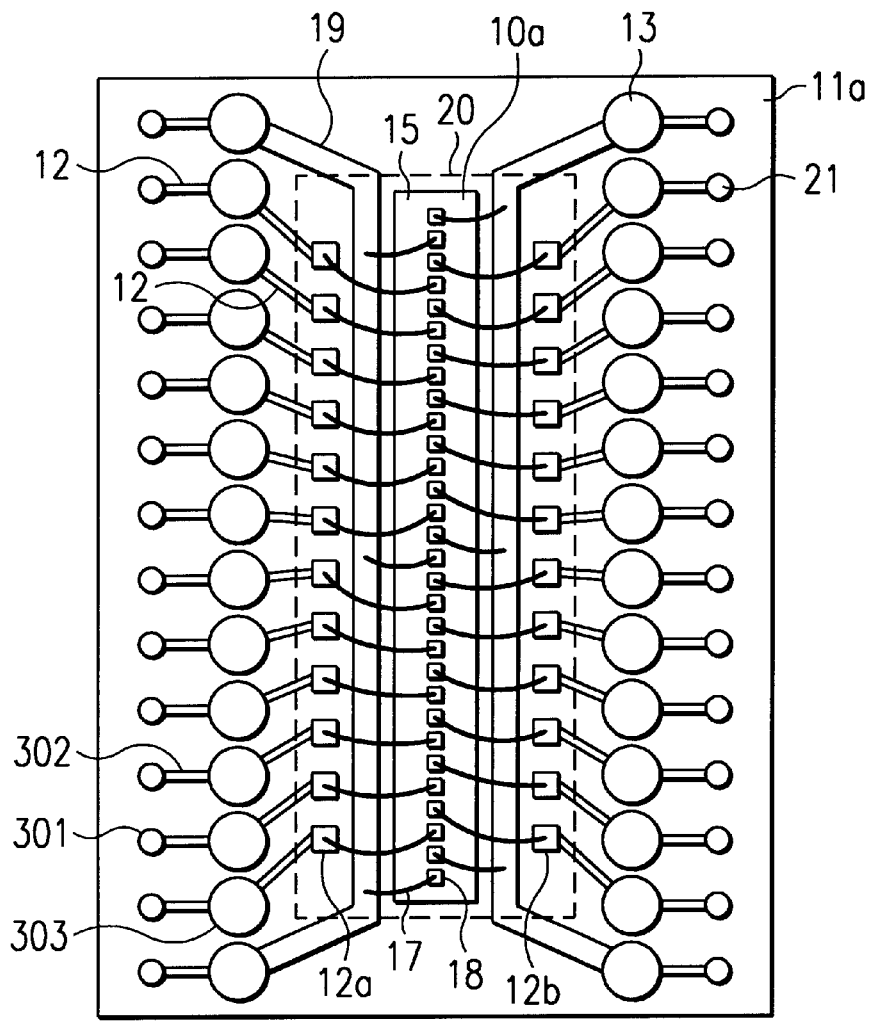
FIGS. 1, 2 and 3 are simplified and schematic views of a first embodiment of the invention, a board-on-chip chip-size package of a semiconductor memory device.
Figure 2:
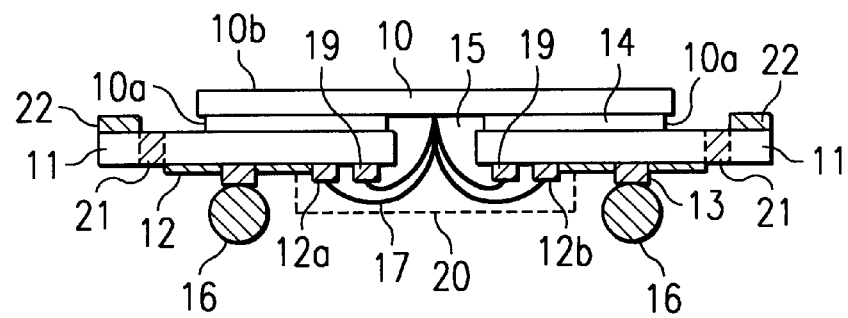
Figure 3:
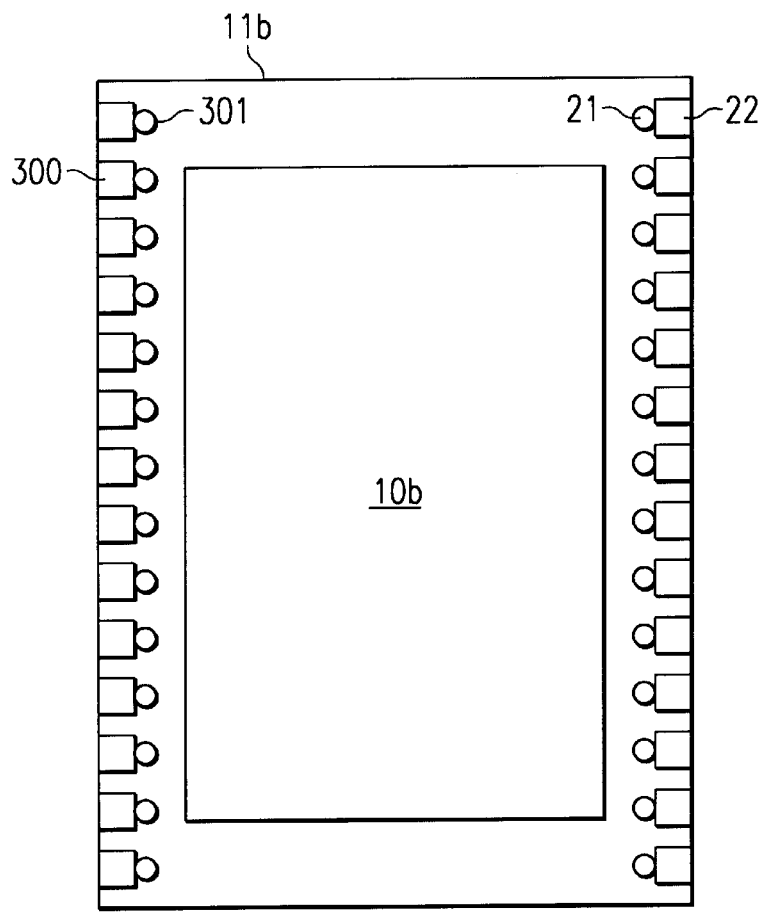

As one embodiment of the invention, FIGS. 1, 2 and 3 show simplified and schematic views of a semiconductor device of the 64 Mbit DRAM family with a board-on-chip chip-size package. FIG. 2 is a cross section, and FIGS. 1 and 3 show top views of the respective surfaces; equal parts are marked by equal reference numbers. Semiconductor chip 10 is, for instance, a silicon integrated circuit component suca as a DRAM, having typically a thickness range from 0.25 to 0.4 mm. In other examples, chip 10 may be a silicon digital signal processor, or be made of gallium arsenide, indium phosphide or any other semiconductor material. The semiconductor chip 10 has a circuit surface 10a and a back surface 10b. The package further has an electrically insulating board 11, referred to as the "carrier", having a first surface 11a and a second surface 11b. Furthermore, the carrier 11 has a plurality of conductive routing strips 12, deposited on its first surface 11a, and thus being integral with carrier 11. These routing strips form a "pattern" and constitute a network of connections for electrical ground, power and signal lines. The ends of the routing strips may be widened, as indicated in FIGS. 1 and 2 by reference numbers 12a and 12b, so that they can serve more easily as contact areas for bonding wire stitches. In addition, there is a plurality of contact pads 13 deposited on first surface 11a of carrier 11, which are designed to comprise location, size and material composition such that they can serve as attachment areas for contact solder balls. Contact pads 13 are typically manufactured by laminating a thin layer of copper over the surface 11a of insulating carrier 11, masking the desired pattern, etching away the remainder of the copper, and adding a flash of gold on the copper surface for easy wetting and metallurgical interdiffusion with the solder material.

Carrier 11 has the silicon chip 10 attached to its second surface 11b such that this second surface 11b faces the silicon surface 10a of chip 10. The attachment between carrier 11 and chip 10 is enabled by an adhesive layer 14. Carrier 11 is made of electrically insulating material such as the epoxy resin FR-4. It has typically a thickness of 0.3 mm. Alternatively, a polyimide-based carrier may be used. The adhesive layer 14 may be made of, for example, a double-sided adhesive polyimide tape.

In well known printed wire technology, the routing strips 12, together with their widened end pads 12a and 12b, are fabricated by laminating a thin layer of copper over the surface 11a of the insulating carrier and masking the desired pattern before etching away the remainder of the copper. Wherever later exposed to ambient, a flash of gold may be added on the copper surface for protection. A change in the layout pattern of routing strips 12 can easily be accomplished by a change of the protective masking used for the etching of the copper.

As shown in FIGS. 1 and 2, carrier 11 has an opening 15. This opening is surrounded by widened end pads of the routing strips, which form a first row 12a of end pads adjacent to one side of opening 15 and a second row 12b of end pads adjacent to the opposite side of opening 15. These rows 12a and 12b of widened pads receive the stitch ends of the bonding whisker wires 17. These wires connect the chip bonding pads 18, arranged generally in the central area of chip 10. In order to fulfill their purpose of interconnection between the bonding wires and the contact pads properly, the routing strips 12 are spaced about the opening 15.

In the embodiment shown in FIGS. 1, 2 and 3, contact pads 13 are positioned in some proximity and along the edges of opening 15 of the carrier. In the embodiment shown in FIGS. 5 and 6, contact pads 13 are positioned in some proximity and along the outline of the carrier. Disposed on these contact pads are solder balls 16 which are needed for attaching the package to the final customer application boards. However, experience has shown that these solder balls 16 be best attached to contact pads 13 only after the device has passed the so-called "burn-in" process; this goal is achievable on the basis of the present invention.

"Burn-in" is performed at the temperature of 125±2° C. for a length of time between 10 and 160 hr, dependent on the maturity of the technology used for manufacturing the semiconductor chips. The purpose is to eliminate product with statistically marginal characteristics caused by statistical variations of fabrication processes. Especially sensitive are devices based on metal-oxide-semiconductor (MOS) technology, particularly memory products with very thin oxide layers. If lead/tin solder material were exposed to ambient at elevated temperatures for many hours, the progressive oxidation of the solder will make its reflow and wetting characteristics difficult.

As can be seen in FIG. 1, a pair of bus bars 19 is positioned parallel and close to the edges of opening 15. The bus bars are electrically connected to one or more of the contact pads 13. The bus bars may serve, for example, as power supplies or grounds. A number of chip bonding pads 18 are connected to the bus bars 19 by bonding wires 17. If the bus bars are designed to be positioned as shown in FIG. 1, they have to receive an electrically insulating film wherever signal bonding wires cross over them, in order to completely eliminate the possibility of an electrical short; however, these insulating layers are expensive and technically undesirable. In other carrier designs, which avoid the need for insulation's, bus bars 19 are located remote from opening 15, and positioned between contact pads 13 and the peripheral edge of carrier 11.

The whisker wires 17 (usually gold, gold alloy, or copper, usually 0.8 to 1.3 $\mu$m diameter) are bonded after the semiconductor chip 10 has been adhered to the carrier 11. Known technology allows a pitch of gold balls between 70 and 100 $\mu$m. Moving the bonder capillary containing the gold wire in a pre-determined and computer-controlled manner through the air will create a wire looping of exactly defined shape. For instance, recent technical advances allow the formation of sequential paths of different looping heights. With this capability, wire loops of controlled height and no sagging for safely crossing the bus bars can be manufactured.

After all the bonding pads 18 that require electrical connection to the carrier 11 have been connected, the opening 15 is filled with potting or molding material (indicated by line 20 in FIGS. 1 and 2) up to a height of about 20 to 50 $\mu$m on top of the maximum wire loop height. Consequently, the potting material will rise significantly (sum of loop height and potting height) over the surface 11a of the carrier.

Rather than using wire bonding, the electrical interconnection between the chip bonding pads and the carrier routing strips can also be accomplished by solder balls or solder bumps using flip-chip processing. In this case, the process step of potting or encapsulating may be omitted. Alternatively, gold bumps or other metal bumps and tape-automated bonding may be used.

The diameter, or thickness, of the solder balls (or solder columns) 16 must exceed the thickness of the potting material 20 extending over the surface 11a. Since the high wire looping necessitates significant potting material thickness, the solder balls must have the relatively large diameter of typically between 0.25 and 0.4 mm. Larger diameter solder balls are being used. As defined herein, the geometrical shape of the solder material is generally referred to by the term "ball" even if the precise shape of the material is not spherical but quite arbitrary; especially after reflow, the solder material can assume various shapes.

Electrically conductive vias 21 through the electrically insulating carrier 11 connect contact pads 13 positioned on the first surface 11a of carrier 11 (and often solder balls 16) to the opposite surface 11b of carrier 11. Frequently, intermediate routing strips 12 bridge any geometrical separation of contact pads and vias, as illustrated in FIG. 1. It is of pivotal importance to the present invention that separate pads 22 for testing be designed and fabricated on surface 11b. These testing pads are electrically connected to respective vias 21 and thus to the respective routing strips 12 and contact pads 13 on the opposite surface 11a. For the testing pads 22, the following goals and criteria are important for design and fabrication:

Location

The location has to be suitable for burn-in and testing of the semiconductor device. In particular, the location has to be compatible with standardized testing operation. This includes fixed external dimensions, continued use of existing test sockets, test heads, and test handlers, and numbers for inputs/outputs high enough to accommodate devices from a whole family of products, including any planned shrink version. Example: The entire family of 64 Mbit DRAM, SRAM and EDO devices in BOC-BGA™ packages as well as TSOP outline. Based on this requirement, FIGS. 2 and 3 show the testing pads 22 located along the "outline", or periphery, of carrier 11. They form parallel rows of pads surrounding the outline of the carrier. The distance of the two rows of pads depicted for the BOC-BGA™ in FIG. 3 is determined by the contacts of the conventional TSOP device. As a consequence, the width of carrier 11 ends up larger than actually required for a chip-size device with board-on-chip configuration, which is determined by the width of chip 10, or approximately by the distance between the rows of contact pads 13. Vias 21 are located next to, and in electrical contact with, testing pads 22. The distance between the vias and the contact pads is bridged by electrically conducting routing strips on surface 11a, integral with carrier 11. As an example, this sequence of geometrical features (and electrical connections) is illustrated in FIG. 3 by testing pad 300, followed by via 301, continued in FIG. 1 by routing strip 302 and contact pad 303.

Size

The size has to allow the reliable positioning of temporary contacts customarily used for burn-in and testing, such as needles, pins, clamps, to the testing pads; if required, this positioning has to be performed at all contacts simultaneously. In particular, the size of the testing pads has to allow the burn-in and testing of BOC-BGA™ devices in installed TSOP burn-in and test sockets.

Composition

The composition of testing pads 22 has to be suitable for both temporary contacting at electrical testing, and permanent contacting at assembly, especially involving the attachment of solder material. A variety of metallurgical compositions are possible; in one preferred embodiment, the composition of testing pads 22 is similar to the composition of the routing strips and contact pads: A thin layer of copper, laminated over the surface 11b of the insulating carrier, masked to the desired pad pattern, defined by etching the remainder of the copper, and protected by a flash of gold. This composition permits the exposure of the testing pads to the elevated temperatures of burn-in without oxidizing the surface, so that solder balls, attached after burn-in, will readily wet and solder the surface. Palladium instead of gold serves the same purpose. If it is desired to minimize metal interdiffusion during the soldering step, a flash of platinum can be used to replace the gold.

After burn-in and testing have been completed, the testing pads 22 may either receive the attachment of solder balls and may thus be converted to contact pads, or remain unconverted. In the latter case, the testing pads may not serve any further function. This may be the general application for devices which remain individual units. On the other hand, further processing of devices into modules, after the testing pads have been converted to contact pads by attaching solder balls, is discussed below in FIG. 7.

As defined herein, "testing" refers to the electrical characterization of semiconductor devices using automated testers. While "testing" is actually a non-value added step in the fabrication of semiconductor products, and substantially adds to the device cost due to the length of time needed for electrical characterization and the high equipment cost of the testers, it represents an essential feature of device specification and thus device quality (in addition to electrical testing, there are numerous reliability tests of the semiconductor device based on accelerating known failure mechanisms under use conditions).

Figure 4:
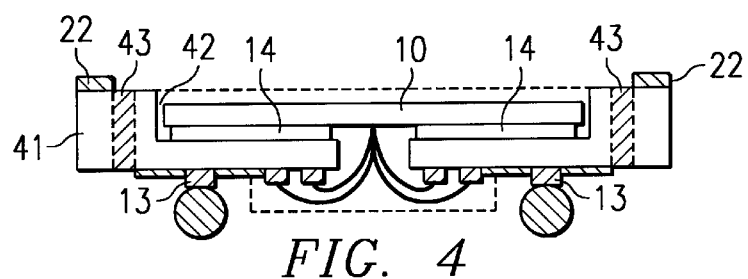
FIG. 4 is the schematic and simplified cross section of a second embodiment of the invention with the semiconductor chip adhered in the cavity of the carrier.

As a second embodiment of the present invention, FIG. 4 illustrates a variation of the BOC-BGA™ of FIG. 2. The electrically insulating carrier 41 comprises a cavity wherein the semiconductor chip 10 is adhered to carrier 41 by adhesive film 14. Compared to FIG. 2, the electrically conductive vias 43 have to traverse a somewhat thicker carrier material, but the electrical contacts to contact pads 13 and testing pads 22 remain similar. In addition, the considerations for location, size and composition of testing pads 22 remain similar.

Figure 5:
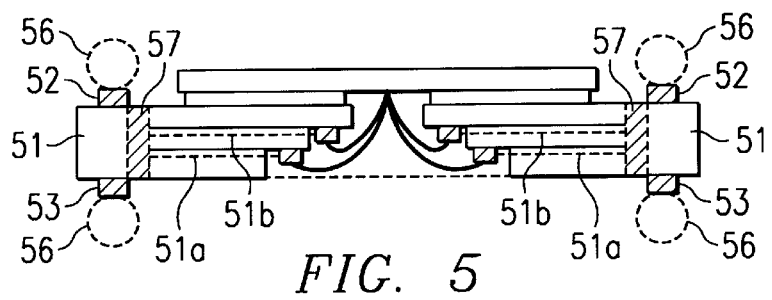
FIGS. 5 and 6 are schematic and simplified cross sections of a third and fourth embodiments of the invention, board-on-chip ball grid arrays with the possibility of attaching solder balls on opposite sides of the carrier.
Figure 6:
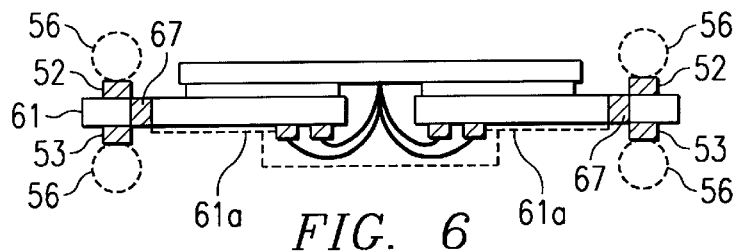

FIGS. 5 and 6 are schematic and simplified cross sections of a couple of further embodiments of the invention. The contact pads 53 have moved to a similarly peripheral position as testing pads 52 in order to enable the eventual attachment of solder balls 56 both to contact pads 52 and testing pads 52 for double-sided further assembly. For this purpose, contact pads as well as testing pads have to be geometrically positioned on the same side of the electrically conductive vias 57 and 67 through electrically insulating carriers 51 and 61, respectively. In FIGS. 5 and 6, contact pads 53 and testing pads 52 are closer to the outline (periphery) of carriers 51 and 61 than vias 57 and 67 respectively, but in other embodiments the vias may connect the centers of the contact pads and testing pads at shortest distance.

Solder balls 56 are depicted by dashed outlines in FIGS. 5 and 6 in order to emphasize the fact that they are attached to the contact pads 53 and testing pads 52 only after the devices have completed burn-in and testing. In this fashion, the advantage offered by the invention is exploited to avoid any deterioration of the solder material due to oxidation during the long exposure to ambient at elevated temperatures.

In contrast to the structure of carrier 61 of the embodiment in FIG. 6. which is similar to the structure of carrier 11 in FIG. 2 with only one level 61a of conductive routing strips, integral with carrier 61, the structure of carrier 51 in the embodiment of FIG. 5 has the added feature of double level metallization 51a and 51b for two levels of routing strips. One level serves electrical power and ground connections, the other level serves the signal line. Each routing strip connects to its respective via and thus to its respective contact and testing pads. Having the routing strips and landing pads for the wire stitches separated into two elevations, the risk of an accidental electrical short by a sagging wire loop is eliminated, and consequently the expensive insulation coating of the stitch pads can be avoided.

Figure 7:
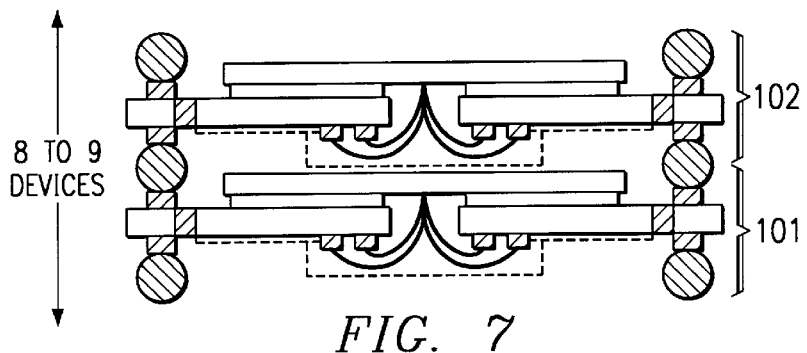
FIG. 7 is the simplified and schematic cross section of a stacked module of semiconductor ball grid array devices as embodiments of the invention.

FIG. 7 illustrates a simplified and schematic cross section of a high density semiconductor module made of electrically connecting two packaged devices like the one shown in FIG. 6. The electrical connection is achieved by stacking the two devices by means of reflowing the solder balls attached to the respective package contact and testing pads. The advantage derived from the present invention focuses on the method of fabricating the module, since the invention offers a unique opportunity in the history of the devices. Selecting a first packaged integrated circuit device, generally designated 101 in FIG. 7, a pattern of contact pads for electrical connection is formed, as well as a pattern of testing pads for electrical characterization. The location of the testing pads is structured for burn-in and testing of the device, taking into account the requirements of existing sockets and equipment constraints according to the invention, and the size and composition of the pads are structured so that they can be converted to contact pads after completing burn-in and testing. Then the operations of burn-in and testing are actually performed. Afterwards, according to the invention, solder balls are attached to each contact pad and each testing pad, which converts the latter to contact pads.

The sequence of process steps is repeated for a selected second packaged integrated circuit device, generally designated 102 in FIG. 7. Both packages are then electrically connected, for instance by stacking using solder reflow. More devices can be added to the module after burn-in and testing of the devices, utilizing the testing pads according to the invention, until a stack of 8 or 9 units has been assembled. The module will still retain its high density, low profile characteristic.

Figure 8:
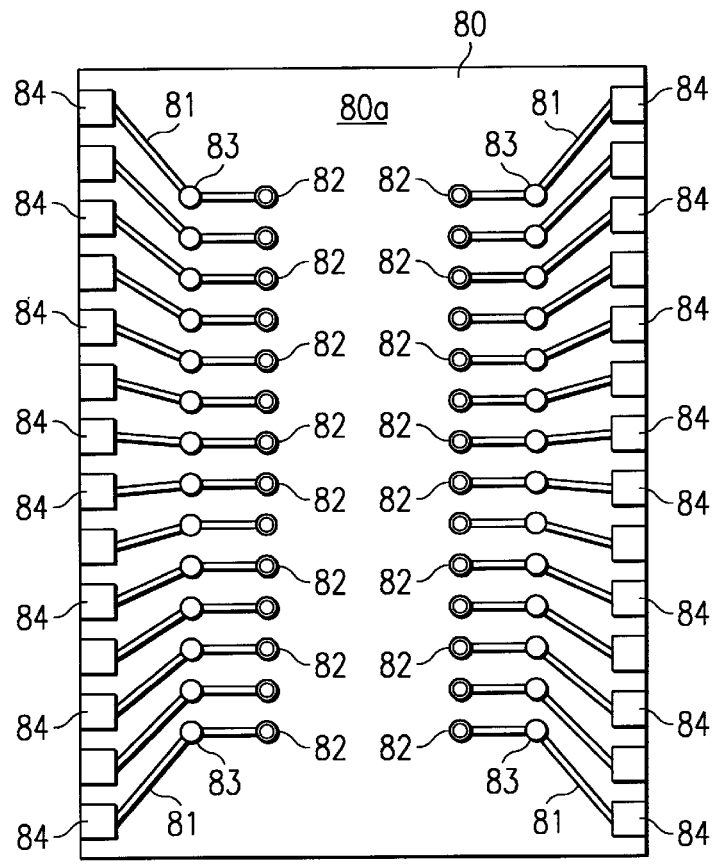
FIG. 8 is the schematic and simplified top view of a fifth embodiment of the invention, a standard auxiliary carrier compatible with thin small-outline package sockets.

FIG. 8 depicts the simplified top view of another embodiment of the invention. Shown is one surface 80a of an electrically insulating carrier 80 having a pattern of electrically conductive routing strips 81 integral with surface 80a. Furthermore, rows of electrically conductive vias 82 connect to the opposite surface (not shown in FIG. 8) of carrier 80. The routing strips 81 connect from the vias 82 to widened rows of pads 83 designed as sites for potential solder attachment of packaged semiconductor devices to be burnt-in and/or tested. The routing strips further connect to rows of testing pads 84, arranged along the outline (periphery) of carrier 80. If desired, the layout of the metallization pattern depicted in FIG. 8 on surface 80a of carrier 80 can be identically repeated on the opposite surface of carrier 80, not shown in FIG. 8. In that case, a packaged semiconductor device can also be attached to the opposite surface.

According to the invention, carrier 80 of FIG. 8 serves as a standard auxiliary carrier so that devices which may be packaged in two different packages, for instance in a ball grid array (BGA) and a thin small outline (TSO) package, can be burnt-in and tested using the same sockets. The packages can be electrically connected to the vias or widened routing strips of the carrier. Independent of the package attached, the testing pads of the carrier are designed for standard burn-in sockets and standard test heads and test change kits. Furthermore, the auxiliary carrier of FIG. 8 is designed for standard transport trays and tubes. The auxiliary carrier does not become a permanent part of the device package, but will be separated again from the device after burn-in and testing have been completed. With the advantage of the adapter carrier of the invention, all burn-in and test sockets and accessories remain unchanged for the device families. Start-up cycle time for new (for instance, shrink) versions of the product are dramatically shortened.

While an auxiliary carrier like the one depicted in FIG. 8 serves a number of device types, the present invention allows a further extension to a methodology covering device families with much wider input/output configurations. As an example from the DRAM devices, the family of 64 Mbit SDRAM devices in the organizations x4, x8, and x16 is assembled in packages with 54 inputs/outputs; the family of 64 Mbit EDO devices in the organizations x4 and x8 is assembled in packages with 32 inputs/outputs; the family of 64 Mbit EDO devices in the organization x16 is assembled in a package with 50 inputs/outputs. Consequently, these different package types require for each package type new tooling and purchases for dedicated, i.e. not interchangeable, burn-in sockets, dedicated burn-in boards, dedicated test handlers and test change kits, dedicated test performance boards, and dedicated trays and tubes.

Figure 9A:
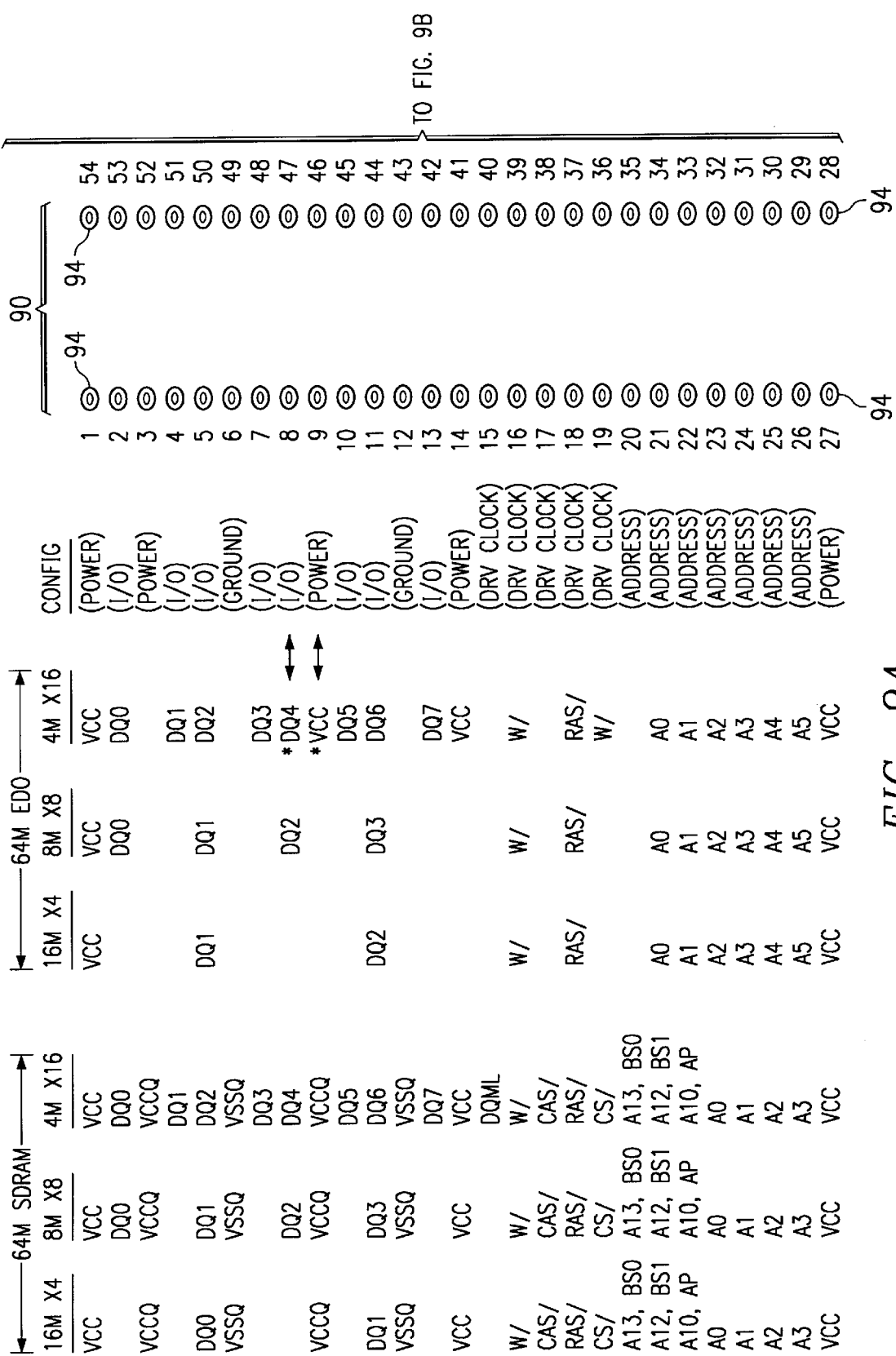
FIG. 9 is table showing a sixth embodiment of the invention, a standard carrier for universal testing and burn-in of families of chip-on board ball grid array devices.
Figure 9B:
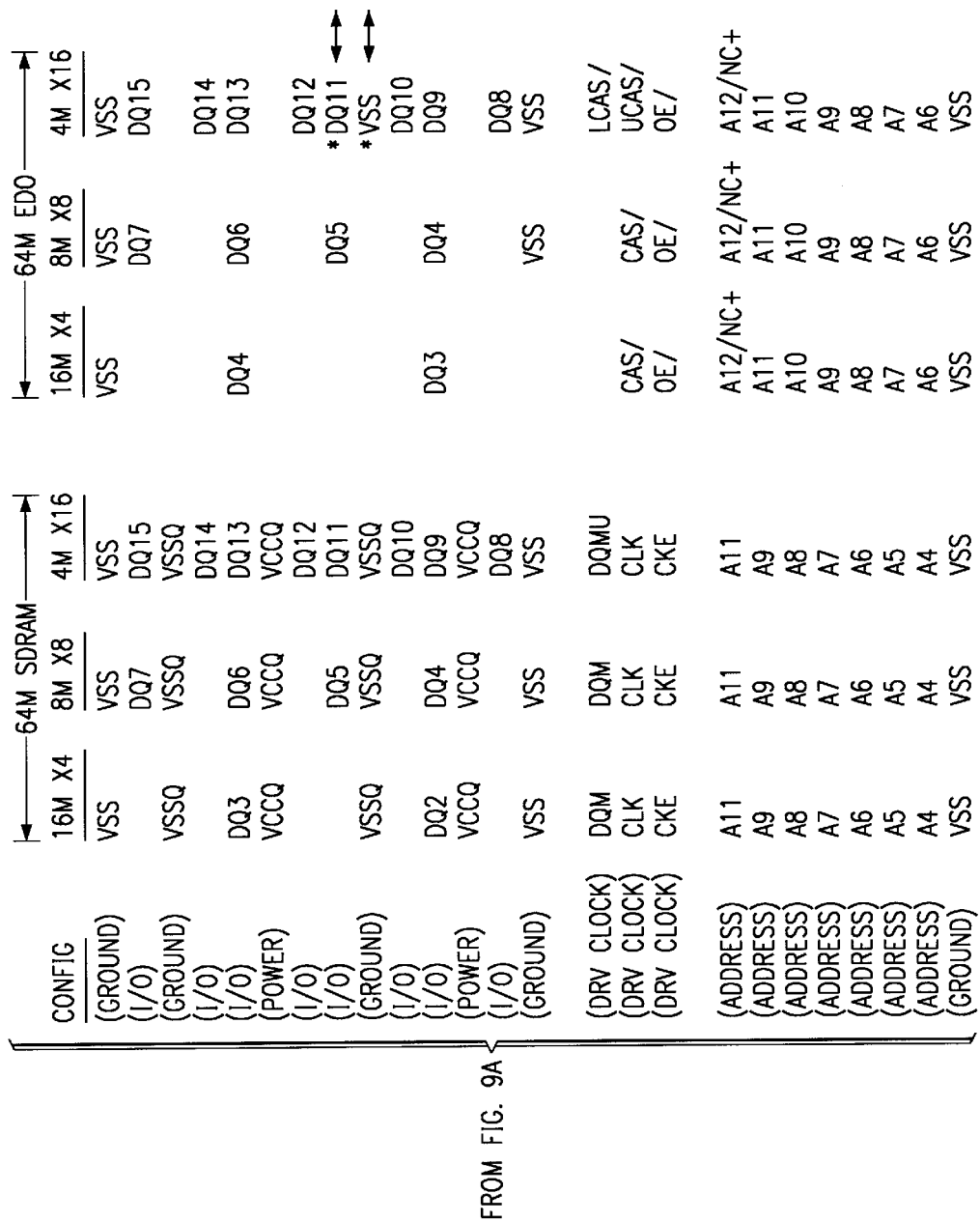

The cost for equipment investment and the time for product start-up can be avoided by expanding the embodiment of FIG. 8 into the concept of FIG. 9 as another embodiment of the present invention. A universal auxiliary carrier is designed with enough inputs/outputs to serve all conceivable configurations of certain product families. In the schematic example of FIG. 9 for semiconductor memory devices, the carrier, generally designated 90, comprises testing pads 94 numbered as inputs/outputs 1 through 54. While the external dimension of the carrier is thus fixed by the design and number of testing pads, the functional assignment and thus the layout of the routing strips is determined by the device packages to be served. In FIG. 9, the layout of routing strips, contact pads and vias is not shown since it varies with the device family to be served, but the layout follows the principles described in FIG. 8.

In the example of FIG. 9, the 54 inputs/outputs are grouped in two rows of 27 inputs/outputs each. The functions commonly served by these terminals are listed next to the terminal numbers. To the left and to the right in FIG. 9 are the assignments for the various organizations in the device families of the 64 Mbit SDRAM and the 64 Mbit EDO products. As can be seen, some terminals may stay unconnected for certain device types. Based on this list of assignments, the patterned of routing strips of carrier 90 is layed out.

Any rerouting of the routing strips is technically easy and does not add cost to the carrier. In well known printed wire technology, the routing strips are fabricated by laminating a thin layer of copper over the electrically insulating carrier and masking the desired pattern before etching away the remainder of the copper. Wherever exposed to ambient, a flash of gold may be added on the copper surface for protection. Consequently, a change of the layout pattern of the routing strips is simply accomplished by a change of the protective masking used for etching the copper.

Carrier 90 is made of electrically insulating material such as the well known epoxy resin FR-4. It has typically a thickness of 0.3 to 0.5 mm. Alternatively, a polyimide-based carrier may be used.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is, therefore, intended that the appended claims encompass any such modifications or embodiments.

What is claimed is:

1. A method for burn-in and testing of a packaged semiconductor device comprising:

forming on said device package a pattern of contact pads for electrical connection and a pattern of testing pads integral with said device for electrical characterization;

structuring said testing pads for burn-in and testing of said device;

structuring said pattern of testing pads such that it can be converted to a pattern of contact pads after said device has been electrically characterized following burn-in;

burning-in and testing said device; and readying said contact pads for electrical connection in assembly.

2. The method according to claim 1 wherein the step of forming said pattern of testing pads on said package includes the selection of a location remote from said contact pads suitable for burn-in and testing of said device.

3. The method according to claim 1 wherein the step of forming said pattern of testing pads on said package further includes the selection of pad size and pad composition suitable for converting said testing pads to contact pads.

4. The method according to claims 1 wherein the step of readying said contacts includes the step of attaching a plurality of solder balls to said contact pads whereby said device can be electrically connected in further assembly.

5. The method according to claim 1 further including the step of attaching a plurality of solder balls to said testing pads after said device has been electrically characterized following burn-in, whereby said testing pads are converted to contact pads.

6. The method according to claim 1 wherein said testing pads remain unconverted to contact pads.

7. A method for the fabrication of a high density semiconductor module comprising:

selecting a first packaged integrated circuit device;

forming on said device package a pattern of contact pads for electrical connection and a pattern of testing pads integral with said device for electrical characterization;

structuring said testing pads for burn-in and testing of said device;

further structuring said pattern of testing pads such that it can be converted to a pattern of contact pads after said device has been electrically characterized following burn-in;

burning-in and testing said device;

attaching a plurality of solder balls to said contact pads, whereby said device can be electrically connected in further assembly;

attaching a plurality of solder balls to said testing pads, whereby said testing pads are converted to contact pads;

selecting a second packaged integrated circuit device;

repeating all of said process steps on said second device package; and connecting electrically said second device to said first device whereby said first and second devices form a module.

* * * * *